US012610569B2

(12) United States Patent
Hsu et al.

(10) Patent No.: US 12,610,569 B2
(45) Date of Patent: Apr. 21, 2026

(54) SILICON CARBIDE SEMICONDUCTOR DEVICE FOR PINCHING OFF LEAKAGE CURRENT

(71) Applicant: Fast SiC Semiconductor Incorporated, Hsinchu City (TW)

(72) Inventors: Fu-Jen Hsu, Hsinchu City (TW); Cheng-Tyng Yen, Hsinchu City (TW); Hsiang-Ting Hung, Hsinchu City (TW)

(73) Assignee: Fast SiC Semiconductor Incorporated, Hsinchu City (TW)

( * ) Notice: Subject to any disclaimer, the term of this patent is extended or adjusted under 35 U.S.C. 154(b) by 607 days.

(21) Appl. No.: 17/966,014

(22) Filed: Oct. 14, 2022

(65) Prior Publication Data

US 2023/0307556 A1 Sep. 28, 2023

Related U.S. Application Data

(60) Provisional application No. 63/323,553, filed on Mar. 25, 2022.

(51) Int. Cl.
| | |
|---|---|
| *H10D 8/60* | (2025.01) |
| *H10D 62/60* | (2025.01) |
| *H10D 62/832* | (2025.01) |

(52) U.S. Cl.
CPC .............. *H10D 8/60* (2025.01); *H10D 62/60* (2025.01); *H10D 62/8325* (2025.01)

(58) Field of Classification Search
CPC ...... H10D 8/60; H10D 62/60; H10D 62/8325; H10D 62/129; H10D 62/115; H10D 62/106; H10D 64/23; H10D 64/64; H10D 62/112; H10D 62/124

USPC .......................................................... 257/77
See application file for complete search history.

(56) References Cited

U.S. PATENT DOCUMENTS

| | | | | |
|---|---|---|---|---|
| 6,703,276 | B2 | 3/2004 | Alok et al. | |
| 9,627,553 | B2 | 4/2017 | Richieri | |
| 10,121,909 | B2 | 11/2018 | Minamisawa et al. | |
| 10,777,689 | B1 * | 9/2020 | Yau ..................... | H10D 62/8325 |
| 2007/0145429 | A1 * | 6/2007 | Francis .................... | H10D 8/60 |
| | | | | 257/E29.313 |
| 2008/0093637 | A1 * | 4/2008 | Sankin ..................... | H10D 8/60 |
| | | | | 257/E29.313 |
| 2011/0260216 | A1 * | 10/2011 | Hebert ..................... | H10D 8/60 |
| | | | | 257/E21.403 |

(Continued)

*Primary Examiner* — Caleb E Henry
*Assistant Examiner* — Pratiksha Jayant Lohakare
(74) *Attorney, Agent, or Firm* — Muncy, Geissler, Olds & Lowe, P.C.

(57) ABSTRACT

A silicon carbide semiconductor device comprises a SiC substrate, a drift layer disposed on the substrate, a plurality of first doping regions formed near a surface of the drift layer, a plurality of second doping regions formed near the surface of the drift layer and between the first doping regions and a first metal layer disposed on the surface of the drift layer. The first metal layer forms an Ohmic contact with the second doped region. The drift layer has a first doping concentration of a first conductivity type and each of the second doping regions has a second doping concentration of the first conductivity type, which is higher than the first doping concentration. Each of the first doping regions has a first depth and each of the second doping regions has a second depth which is smaller than the first depth.

7 Claims, 8 Drawing Sheets

(56)  References Cited

U.S. PATENT DOCUMENTS

| | | | | |
|---|---|---|---|---|
| 2012/0248530 A1* | 10/2012 | Lui | ......................... | H10D 8/60 |
| | | | | 257/334 |
| 2013/0069146 A1* | 3/2013 | Okumura | .............. | H10D 64/62 |
| | | | | 257/E21.135 |
| 2014/0001489 A1* | 1/2014 | Yen | ....................... | H10D 8/605 |
| | | | | 257/77 |
| 2014/0001490 A1* | 1/2014 | Konstantinov | ...... | H10D 62/126 |
| | | | | 257/77 |
| 2017/0271158 A1* | 9/2017 | Minamisawa | ...... | H01L 21/0485 |
| 2018/0076289 A1* | 3/2018 | Kurokawa | .......... | H10D 30/668 |
| 2022/0320295 A1* | 10/2022 | Ngwendson | ......... | H10D 64/516 |

* cited by examiner

SILICON CARBIDE SEMICONDUCTOR DEVICE FOR PINCHING OFF LEAKAGE CURRENT

FIELD OF THE INVENTION

The present disclosure relates to a silicon carbide semiconductor device and more particularly to a silicon carbide power semiconductor device for pinching off leakage current.

BACKGROUND OF THE INVENTION

Silicon carbide (SiC) Schottky rectifiers (or Schottky barrier diodes, SBD) are unipolar devices, which provide lower losses and improve efficiencies compared to conventional, bipolar silicon (Si) PiN rectifiers, in many power electronics applications such as switch-mode power supplies (SMPS), inverters and converters. However, because the bandgap of SiC is 3.2 eV, higher than the 1.1 eV bandgap of Si, a typical cut-in voltage (where the rectifiers start to conduct current) of SiC SBD is around 0.9V~1V, which is higher than a typical cut-in voltage of Si PiN diodes (around 0.7V). Higher cut-in voltage of SiC SBD increases the conduction loss of SiC SBD compared to Si PiN diode and adversely impacts the light-load efficiency.

SUMMARY OF THE INVENTION

A silicon carbide semiconductor device according to an embodiment of the present invention comprises: a SiC substrate of a first conductivity type; a drift layer of the first conductivity type disposed on the substrate; a plurality of first doping regions of a second conductivity type formed near a surface of the drift layer, each of the first doping regions being spaced from each other; a plurality of second doping regions of the first conductivity type formed near the surface of the drift layer and between the first doping regions; a first metal layer disposed on the surface of the drift layer, the first metal layer forming an Ohmic contact with the second doped region; and wherein the drift layer has a first doping concentration of the second conductivity type, each of the second doping regions has a second doping concentration of the first conductivity type, which is equal or higher than the first doping concentration; and wherein each of the first doping regions has a first depth (D1), each of the second doping regions has a second depth (D2) which is smaller than the first depth (D1).

A silicon carbide semiconductor device according to an embodiment of the present invention comprises: a SiC substrate of a first conductivity type; a drift layer of the first conductivity type disposed on the substrate; a plurality of recess portions recessed from a surface of the drift layer, each of the recess portions being spaced from each other along the surface of the drift layer; a plurality of first doping regions of a second conductivity type formed below a bottom of the recess portion; a plurality of second doping regions of a first conductivity type formed near the surface of the drift layer and between the recess portions; and a first metal layer filled into the recess portions and formed an Ohmic contact with the second doping region; wherein the drift layer has a first doping concentration of the first conductivity type, each of the second doping regions has a second doping concentration of the first conductivity type, which is equal or higher than the first doping concentration; and wherein each of the recess portion has a third depth (D3), each of the second doping region has a second depth (D2) which is smaller than the third depth (D3).

DETAILED DESCRIPTION OF THE PREFERRED EMBODIMENTS

Figure 1A:
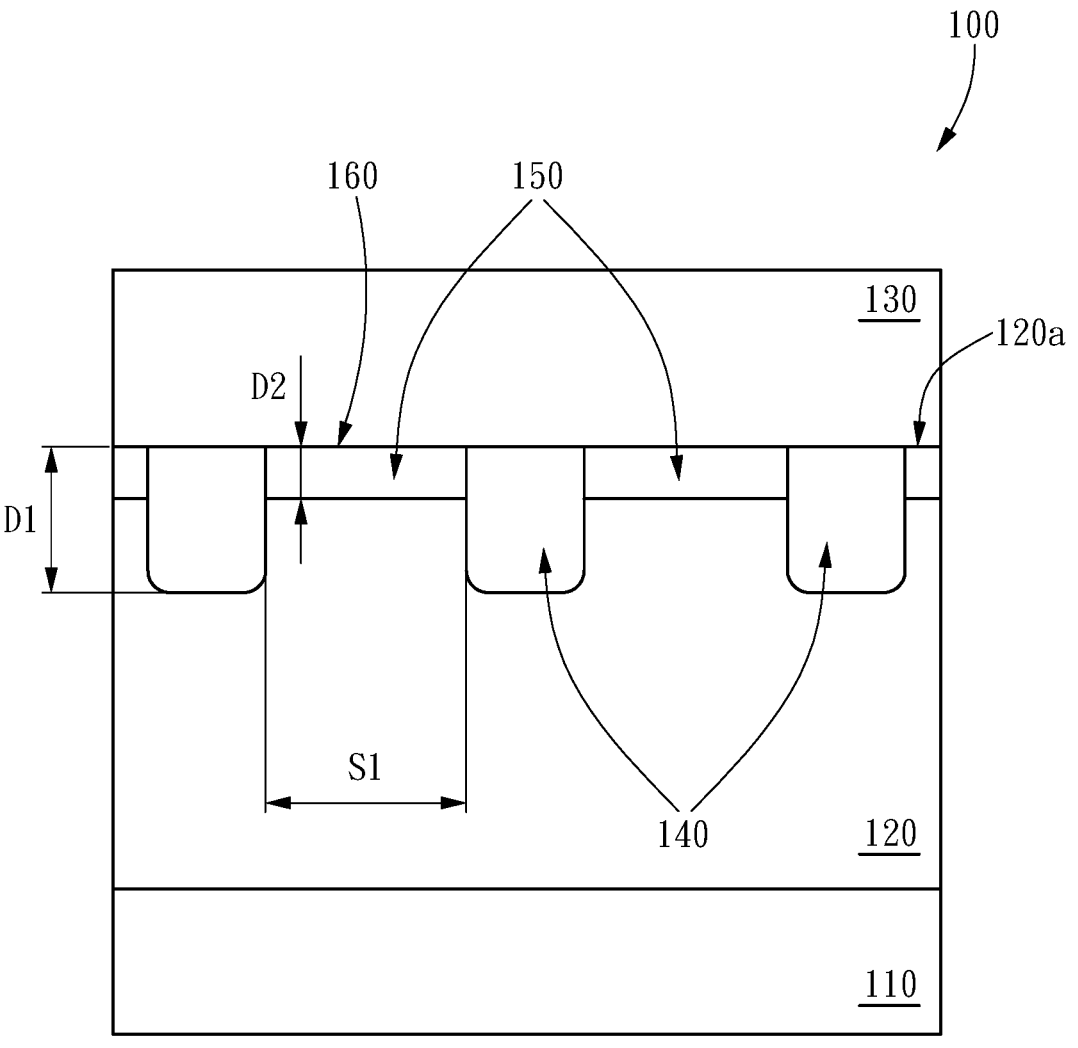
FIG. 1A and FIG. 1B show a partial cross-sectional view of the silicon carbide semiconductor device according to a first embodiment of the present disclosure.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

As used herein, the term "and/or" includes any and all combinations of one or more of the associated listed items.

It will also be understood that when an element such as a layer, portion, region, or substrate is referred to as being "on", "overlie" or "atop" another element, it can be directly on, directly overlie or directly atop the other element or intervening elements may also be present. In contrast, when an element is referred to as being "directly on", "directly overlie" or "directly atop" another element, there are no intervening elements present. Likewise, it will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below", "above", "upper", "lower", "horizontal", "lateral" or "vertical" may be used herein to describe a relationship of one element, layer, portion, or region to another element, layer, portion, or region as illustrated in the figures. It will be understood that these terms and those discussed above are intended to encompass different orientations of the device in addition to the orientation depicted in the figures.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. It will be further understood that the terms "comprises", "comprising", "includes", and/or "including" when used herein specify the presence of stated features, elements, and/or components, but do not preclude the presence or addition of one or more other features, elements, components, and/or groups thereof. The indefinite articles and the definite articles shall encompass both the plural and singular unless the opposite is clearly apparent from the context.

The present disclosure is related to silicon carbide (SiC) rectifiers. In some implementations, the SiC rectifiers described herein can be used in high power applications which have a controllable and low turn-on voltage. The low turn-on voltage of the SiC rectifier could be achieved by various approaches, such as adjusting implant doses, implant depths, channel depths, etc.

In the context of the present specification, n-doped is referred to as a first conductivity type while p-doped is referred to as a second conductivity type. Alternatively, the semiconductor devices can be formed with opposite doping relations so that the first conductivity type can be p-doped and the second conductivity type can be n-doped.

In the following disclosure, example implementations of a silicon carbide (SiC) rectifier are described. FIG. 1A is a partial cross-sectional view illustrating a configuration of the silicon carbide semiconductor device 100 according to a first embodiment of the present disclosure. The device 100 comprises a SiC substrate 110, a drift layer 120, and a first metal layer 130. The SiC substrate 110 may have a first conductivity type (e.g., n-type). The drift layer 120 is disposed on the substrate 110 and may have the first conductivity type. The device 100 further comprises a plurality of first doping regions 140 and a plurality of second doping regions 150. The first doping regions 140 are disposed near a surface 120a of the drift layer 120 and may have a second conductivity type (e.g., p-type). The second doping regions 150 are also disposed near the surface 120a of the drift layer 120 and may have the first conductivity type. In one embodiment, the drift layer 120 is n-type, and a doping concentration of the drift layer 120 in a non-limiting example is 1E16 cm^-3. The first doping region 140 is p-type, and a doping concentration of the first doping region 140 in a non-limiting example is 1E18 cm^-3. The second doping region 150 is n-type, and a doping concentration of the second doping region 150 in a non-limiting example is 5E19E^-3.

In a certain region of the drift layer 120, the first doping regions 140 each having a first depth (D1) and spacing apart from each other are formed through an ion implantation followed by activation annealing. The first depth (D1) of the first doping region 140 is defined as a depth of PN junction formed between the drift layer 120 and the first doping region 140. In a non-limiting example, the first depth (D1) is 0.5 μm, and a thickness of the drift layer 120 is 5 μm. A first spacing (S1) between adjacent ones of the first doping regions 140 is 1 μm. Between the adjacent first doping regions 140, the second doping regions 150 each having a second depth (D2) are formed in the drift layer 120. The second depth (D2) of the second doping region 150 is 0.2 μm. The first doping regions 140 and the second doping regions 150 may be homogeneously spaced apart from one another, and may have the same width and/or may form a regular pattern, respectively.

The first metal layer 130 is disposed on the surface 120a of the drift layer 120 so as to be in contact with the first doping regions 140 and the second doping regions 150, whereby the first metal layer 130 forms an Ohmic contact 160 with the second doped regions 150. The first metal layer 130 may comprise a combination of a stoichiometric compound with a non-stoichiometric compound or a layered combination comprising several metals or alloys. For example, the first metal layer 130 may comprise a mixture of $M_x N_y$ having different values for x and y, where M denotes the metal. For example, the metal may be selected from the group of molybdenum, titanium, tantalum, and tungsten. In another example, the first metal layer 130 may comprise a nickel silicide layer, a titanium layer and a AlCu layer that are arranged from bottom to top. In one example, the first metal layer 130 forms a lower barrier Schottky contact with the second doping region 150, while in another example, the first metal layer 130 forms an Ohmic contact with the second doping region 150.

Figure 1B:
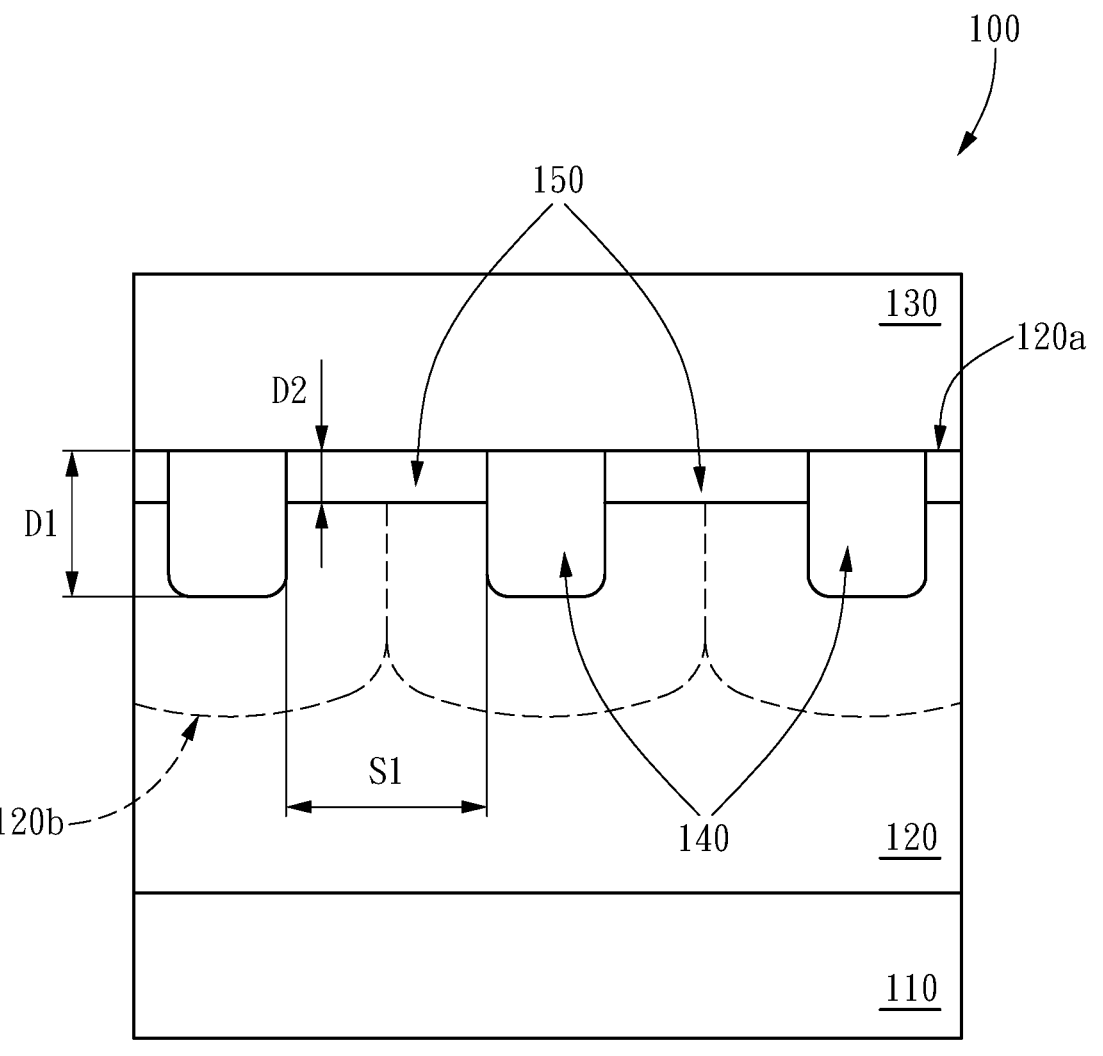

FIG. 1B illustrates the semiconductor device 100 with regard to FIG. 1A when a reverse bias is applied for yet another embodiment. A first doping concentration of the n-type drift layer 120 is 1E16 cm^-3 and a thickness of the drift layer 120 is 7 μm; a second doping concentration of the second doping region 150 is 5E19 cm^-3, a first depth (D1) of the first doping region 140 is 4 μm. A third doping concentration of the first doping region 140 is 5E18 cm^-3 and a second depth (D2) of the second doping region 150 is 0.1 μm. A first spacing (S1) between adjacent ones of the first doping regions 140 is 0.5 μm. The third doping concentration of the first doping region 140, the first doping concentration of the drift layer 120, the first depth (D1) and the first spacing (S1) are configured such that a region 120b of the drift layer 120 between the first doping region 140 is completely depleted. Such depletion in the region 120b causes to pinch off a leakage current when the reverse bias is applied to the silicon carbide semiconductor device 100.

Based on the structure of the silicon carbide semiconductor device 100, the low conduction power loss under forward bias is provided. By virtue of the depletion in the region 120b, blocking leakage current may be achieved and the leakage current under the reverse bias could be lowered, even with a low turn-on voltage under forward bias conditions. By using such characteristics, it is possible to realize a low-knee-voltage or quasi-knee-voltage-free SiC rectifier.

Figure 2:
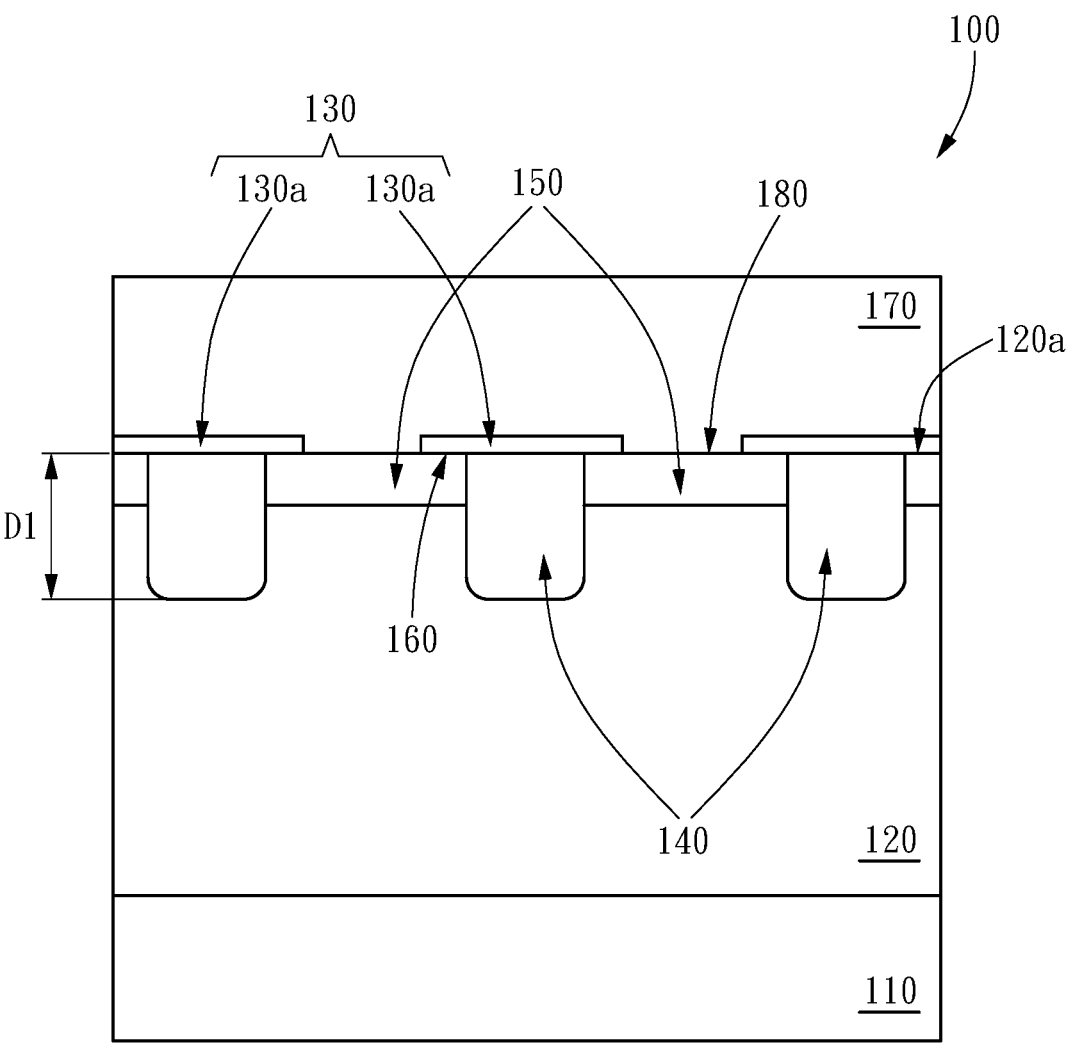
FIG. 2 shows a partial cross-sectional view illustrating a configuration of the silicon carbide semiconductor device according to Variation 1 of the first embodiment of the present disclosure.

FIG. 2 is a partial cross-sectional view illustrating a configuration of the silicon carbide semiconductor device 100 according to Variation 1 of the first embodiment of the present disclosure. As shown in FIG. 2, the first metal layer 130 includes a plurality of separate structures 130a. Each of the spaced-apart structure 130a overlies the first doping region 140 and an area of the second doping region 150 surrounding the first doping region 140. The silicon carbide semiconductor device 100 further comprises a second metal layer 170 disposed on the first metal layer 130 and the second doping regions 150. Each of the structures 130a of the first metal layer 130 forms an Ohmic contact 160 to the second doping regions 150. The second metal layer 170 forms a Schottky contact 180 with the second doped regions 150.

Figure 3:
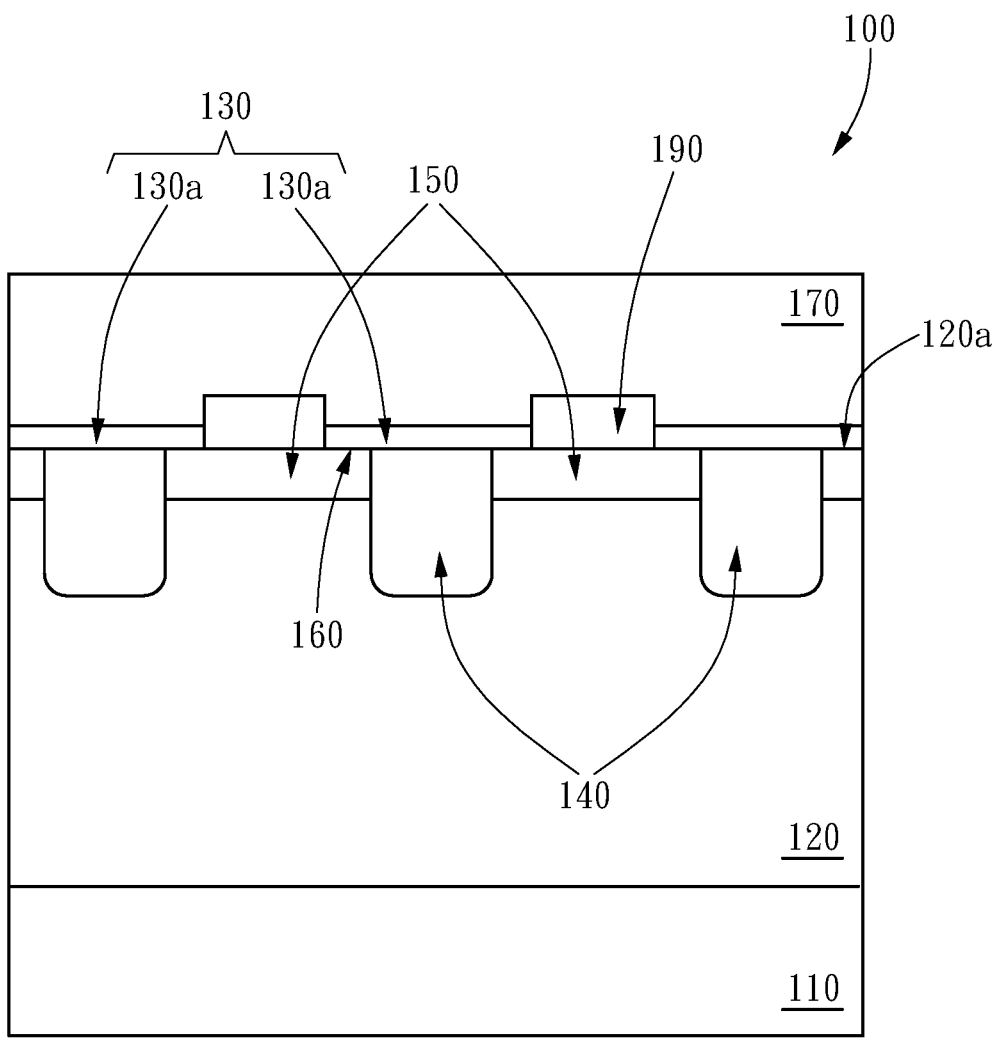
FIG. 3 shows a partial cross-sectional view illustrating a configuration of the silicon carbide semiconductor device according to Variation 2 of the first embodiment of the present disclosure.

FIG. 3 is a partial cross-sectional view illustrating a configuration of the silicon carbide semiconductor device 100 according to Variation 2 of the first embodiment of the present disclosure. As shown in FIG. 3, The silicon carbide semiconductor device 100 further comprises an oxide layer 190, which is disposed on a portion of the second doping regions 150.

Figure 4A:
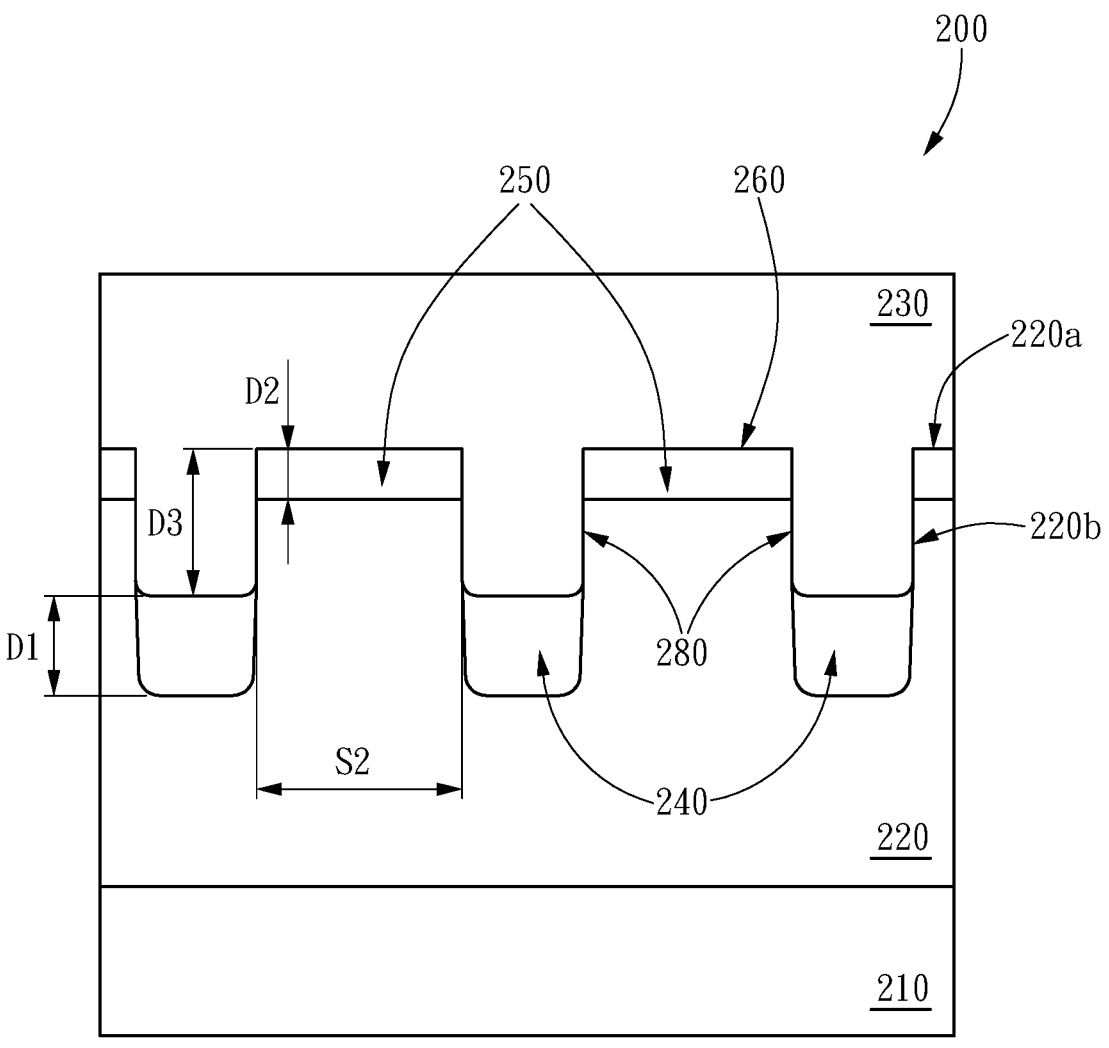
FIG. 4A and FIG. 4B show a partial cross-sectional view of the silicon carbide semiconductor device according to a second embodiment of the present disclosure.

FIG. 4A is a partial cross-sectional view illustrating a configuration of the silicon carbide semiconductor device 200 according to a second embodiment of the present disclosure. The device 200 comprises a SiC substrate 210, a drift layer 220, and a first metal layer 230. The SiC substrate 210 may have a first conductivity type (e.g., n-type). The drift layer 220 is disposed on the substrate 210 and may have the first conductivity type. A plurality of recess portions 220*b* is formed at a surface 220*a* of the drift layer 220 and recessed from the surface 220*a*. In an example implementation, the recess portion 220*b* may be a trench structure formed by excavating, etching or any other possible methods. In a non-limiting example, a second spacing (S2) between adjacent ones of the recess portions 220*b* is 0.8 μm.

The device 200 further comprises a plurality of first doping regions 240 and a plurality of second doping regions 250. The first doping regions 240 are disposed below a bottom of the recess portions 220*b* and may have a second conductivity type (e.g., p-type). The second doping regions 250 are also disposed near the surface 220*a* of the drift layer 220 and may have the first conductivity type. In a non-limiting example, a first doping concentration of the drift layer 220 is 1.5E16 cm^−3. A second doping concentration of the second doping regions 250 is 1E19 cm^−3. And a third doping concentration of the first doping region 240 is 1E19 cm^−3. A thickness of the drift layer 220 is 7 μm, a first depth (D1) of the first doping region 240 is 0.6 μm, a second depth (D2) of the second doping region 250 is 0.3 μm and a third depth (D3) of the recess portions 220*b* is 1.2 μm.

The first metal layer 230 is disposed on the surface 220*a* of the drift layer 220 and filled into the recess portions 220*b*, so as to be in contact with the first doping regions 240 and the second doping regions 250. As a result, the first metal layer 230 forms a low barrier Schottky contact or an Ohmic contact 260 with the second doped regions 250. In an alternative example, the first metal layer 230 in the recess portion 220*b* may form a Schottky contact 280 with the drift layer 220 along a sidewall between the recess portion 220*b* and the drift layer 220.

Figure 4B:
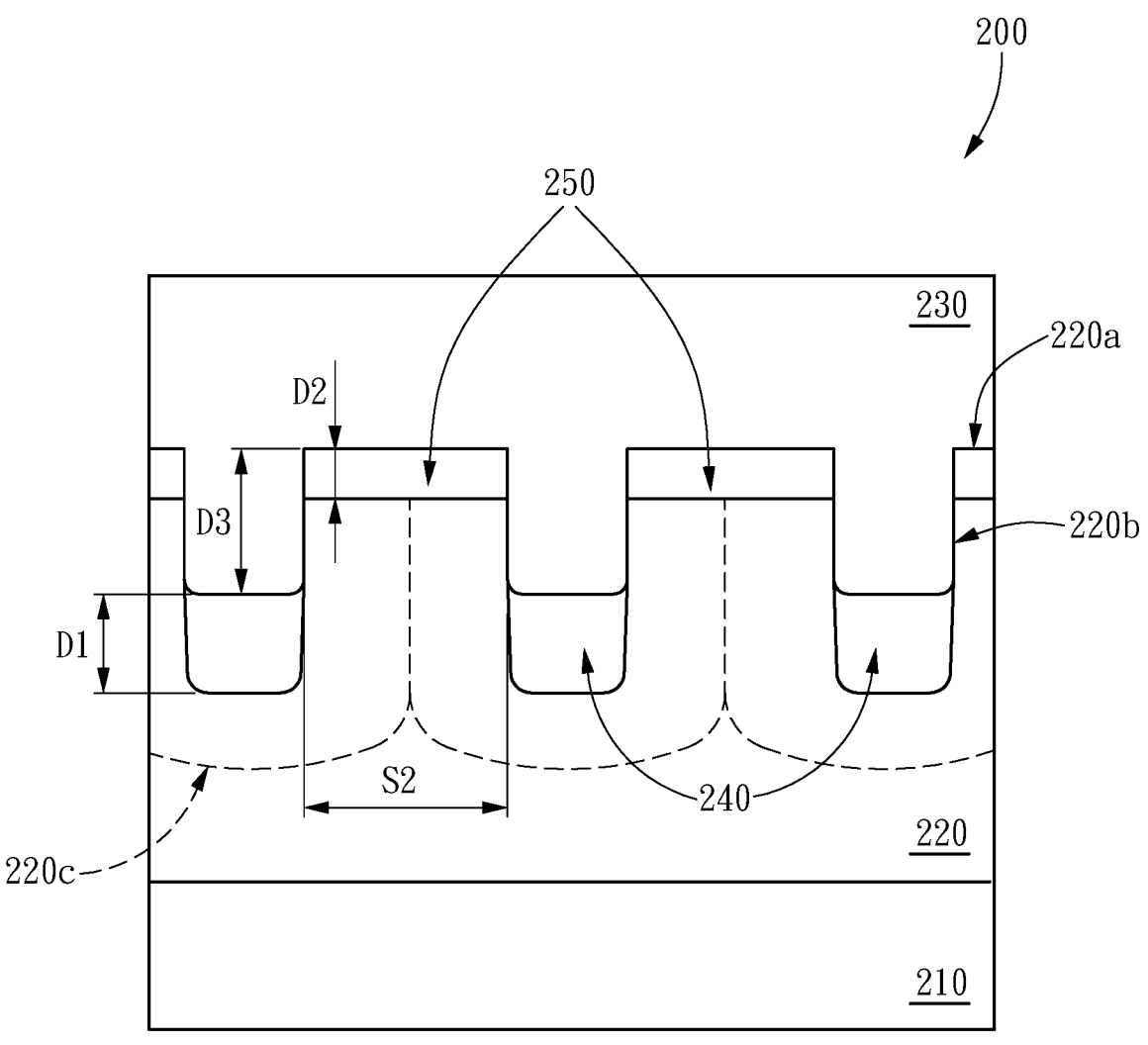

FIG. 4B illustrates the semiconductor device 200 with regard to FIG. 4A when a reverse bias is applied. In the present embodiment, the third doping concentration of the first doping region 240, the first doping concentration of the drift layer 220, the second spacing (S2), the first depth (D1) and the third depth (D3) are configured such that a region 220*c* of the drift layer 220 between the recess portions 220*b* is completely depleted to pinch off a leakage current when a reverse bias is applied to the silicon carbide semiconductor device 200.

Figure 5:
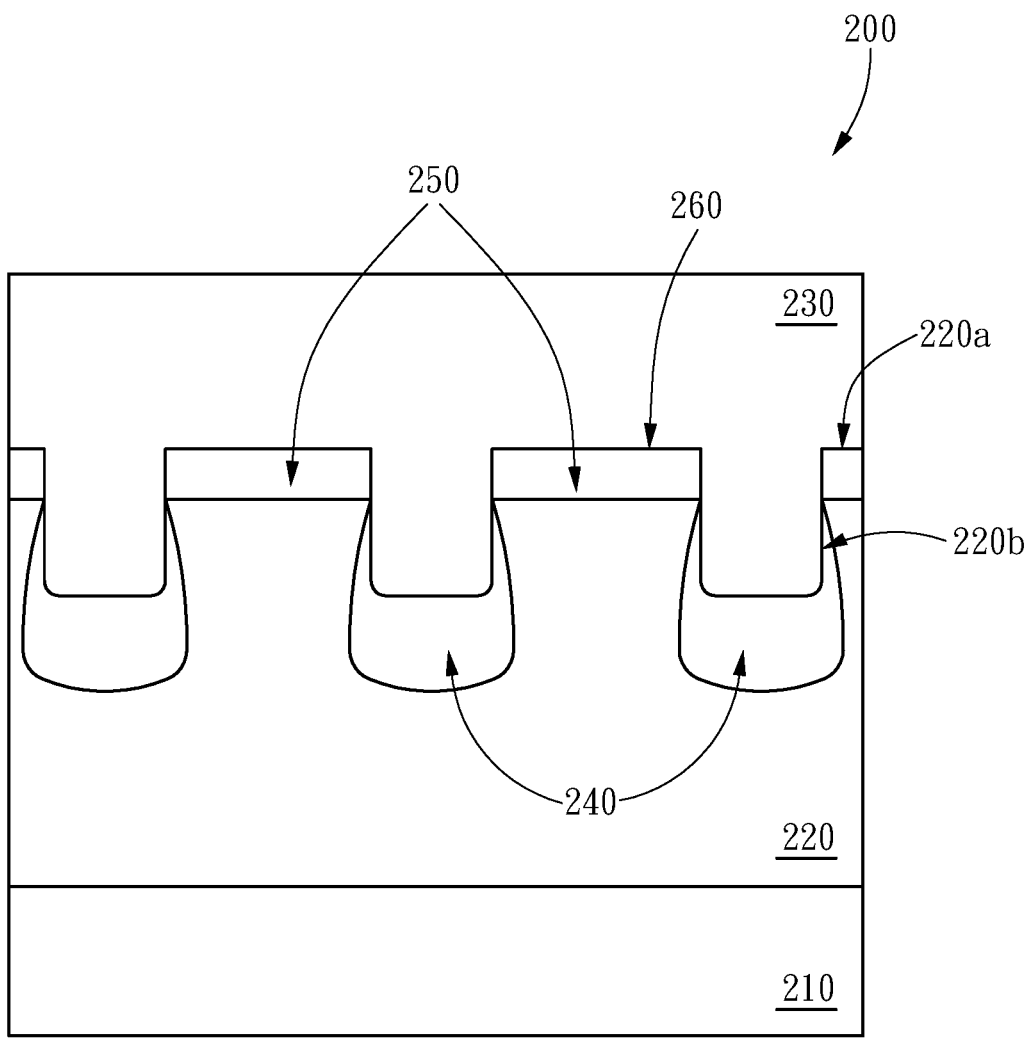
FIG. 5 shows a partial cross-sectional view illustrating a configuration of the silicon carbide semiconductor device according to Variation 1 of the second embodiment of the present disclosure.

FIG. 5 is a partial cross-sectional view illustrating a configuration of the silicon carbide semiconductor device 200 according to Variation 1 of the second embodiment of the present disclosure. As shown in FIG. 5, the first doping region 240 is formed to extend upwardly to adjoin a sidewall of the recess portion 220*b*.

Figure 6:
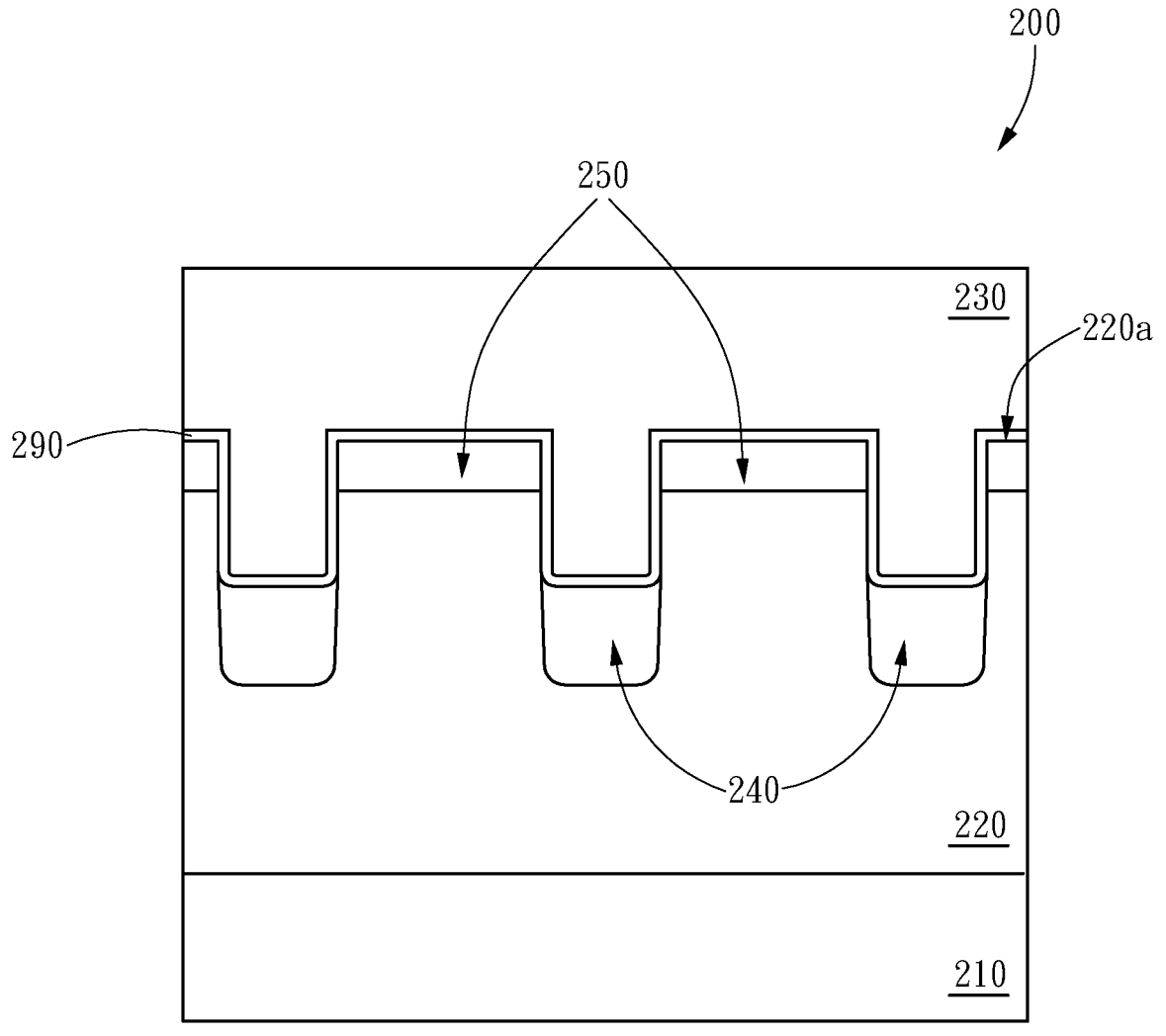
FIG. 6 shows a partial cross-sectional view illustrating a configuration of the silicon carbide semiconductor device according to Variation 2 of the second embodiment of the present disclosure.

FIG. 6 is a partial cross-sectional view illustrating a configuration of the silicon carbide semiconductor device 200 according to Variation 2 of the second embodiment of the present disclosure. As shown in FIG. 6, The silicon carbide semiconductor device 200 further comprises a polysilicon layer 290 disposed on an inner surface of the recess portions 220*b*. The polysilicon layer 290 forms heterojunction a low barrier Schottky contact or an Ohmic contact with the second doping region 250 and a high barrier Schottky contact with the recess portion 220*b* of the drift layer 220. In the presence of the polysilicon layer 290, the knee voltage of forward conduction and the reverse leakage current of the rectifier could be reduced.

What is claimed is:

1. A silicon carbide semiconductor device, comprising:
a SiC substrate of a first conductivity type;

a drift layer of the first conductivity type disposed on the substrate;

a plurality of first doping regions of a second conductivity type formed near a surface of the drift layer, each of the first doping regions being spaced from each other;

a plurality of second doping regions of the first conductivity type formed near the surface of the drift layer, each sandwiched between two of the first doping regions;

a first metal layer disposed on the surface of the drift layer, the first metal layer being in direct contact with the first doping regions and forming an Ohmic contact with the second doped region; and wherein the drift layer has a first doping concentration of the first conductivity type, each of the second doping regions has a second doping concentration of the first conductivity type, which is equal or higher than the first doping concentration;

wherein each of the first doping regions has a first depth (D1), each of the second doping regions has a second depth (D2) which is smaller than the first depth (D1); and wherein each of the first doping regions has a third doping concentration of the second conductivity type and a first spacing (S1) is provided between the first doping regions, wherein the first depth (D1) of the first doping regions, the third doping concentration of the first doping regions and the first doping concentration of the drift layer are configured such that a region of the drift layer between the first doping regions is completely depleted to pinch off a leakage current when a reverse bias is applied to the silicon carbide semiconductor device, wherein the first depth is on an order of magnitude of 1 μm, the third concentration is on an order of magnitude of 1E18 cm^−3, and the first doping concentration is on an order of magnitude of 1E16 cm^−3.

2. The silicon carbide semiconductor device of claim 1, further comprising a second metal layer disposed on the first metal layer and the second doping regions, which forms a Schottky contact with a portion of the second doped regions.

3. The silicon carbide semiconductor device of claim 1, further comprising an oxide layer disposed on a portion of the second doping regions.

4. A silicon carbide semiconductor device, comprising:
a SiC substrate of a first conductivity type;

a drift layer of the first conductivity type disposed on the substrate;

a plurality of recess portions recessed from a surface of the drift layer, each of the recess portions being spaced from each other along the surface of the drift layer;

a plurality of first doping regions of a second conductivity type formed below a bottom of the recess portion;

a plurality of second doping regions of a first conductivity type formed near the surface of the drift layer, each sandwiched between two of the recess portions; and a first metal layer filled into the recess portions and formed an Ohmic contact with the second doping region;

wherein the drift layer has a first doping concentration of the first conductivity type, each of the second doping regions has a second doping concentration of the first conductivity type, which is equal or higher than the first doping concentration;

wherein each of the recess portions has a third depth (D3), each of the second doping regions has a second depth (D2) which is smaller than the third depth (D3); and wherein each of the first doping regions has a third doping concentration of the second conductivity type, and a spacing is provided between the recess portions, wherein the third doping concentration of the first doping regions and the first doping concentration of the drift layer are configured such that a region of the drift layer between the recess portions is completely depleted to pinch off a leakage current when a reverse bias is applied to the silicon carbide semiconductor device, wherein the third concentration is on an order of magnitude of $1E19 \text{ cm}^{-3}$, and the first doping concentration is on an order of magnitude of $1E16 \text{ cm}^{-3}$.

5. The silicon carbide semiconductor device of claim 4, wherein the first metal layer in the recess portion forms a Schottky contact with the drift layer along a sidewall between the recess portion and the drift layer.

6. The silicon carbide semiconductor device of claim 4, wherein the first doping region extends upwardly to adjoin a sidewall of the recess portion.

7. The silicon carbide semiconductor device of claim 4, further comprising a polysilicon layer disposed on an inner surface of the recess portions.

* * * * *